US009742306B2

(12) United States Patent
Otsubo

(10) Patent No.: US 9,742,306 B2
(45) Date of Patent: Aug. 22, 2017

(54) CONVERTER DEVICE

(71) Applicant: Mitsubishi Electric Corporation, Tokyo (JP)

(72) Inventor: Masahiro Otsubo, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/301,625

(22) PCT Filed: Feb. 25, 2015

(86) PCT No.: PCT/JP2015/055436
§ 371 (c)(1),
(2) Date: Oct. 3, 2016

(87) PCT Pub. No.: WO2016/135892
PCT Pub. Date: Sep. 1, 2016

(65) Prior Publication Data
US 2017/0179843 A1 Jun. 22, 2017

(51) Int. Cl.
*H02M 7/04* (2006.01)
*H02M 7/00* (2006.01)
(Continued)

(52) U.S. Cl.
CPC .............. *H02M 7/003* (2013.01); *H02M 7/02* (2013.01); *H02M 7/04* (2013.01); *H02M 2001/0009* (2013.01)

(58) Field of Classification Search
CPC .......... H02M 7/003; H02M 7/02; H02M 7/04; H02M 7/1552; H02M 7/1555; H02M 2007/04; H02M 2007/217; H02M 2007/48
See application file for complete search history.

(56) References Cited

U.S. PATENT DOCUMENTS 5,274,322 A * 12/1993 Hayashi ............... H02K 3/28
310/198
5,969,966 A * 10/1999 Sawa ................... H02M 5/271
363/10
(Continued)

FOREIGN PATENT DOCUMENTS

JP  2003-235266 A  8/2003
JP  2004-364385 A  12/2004
(Continued)

OTHER PUBLICATIONS

Decision to Grant a Patent for Japanese Patent Application No. 2016-528037, dated Jul. 5, 2016.
(Continued)

*Primary Examiner* — Matthew Nguyen
(74) *Attorney, Agent, or Firm* — Sughrue Mion, PLLC; Richard C. Turner

(57) ABSTRACT

A converter device includes: a converter circuit unit converting alternating-current voltages from a Δ connection and a Y connection of a twelve-phase rectification transformer, into a direct-current voltage; a current detection unit detecting a current of a direct-current bus connected to the converter circuit unit; an open-phase detection unit connected to a side of the Δ or Y connection to detect whether open phase is caused in the connection connected thereto; and an output unit outputting, when detected that there is open phase caused in the Δ or Y connection based on a detection signal of the open-phase detection unit and a current value of the direct-current bus detected by the current detection unit, an indication that open phase is caused in the Δ or Y connection. When open phase is caused, it is possible to output an indication of whether the open phase is caused on the Δ or Y connection side.

3 Claims, 6 Drawing Sheets

(51) Int. Cl.
*H02M 7/02* (2006.01)
*H02M 1/00* (2006.01)

(56) References Cited

U.S. PATENT DOCUMENTS

| | | | |
|---|---|---|---|
| 9,641,094 B2 * | 5/2017 | Kato | H02M 7/06 |
| 2014/0043870 A1 * | 2/2014 | Swamy | H02M 1/12 |
| | | | 363/36 |
| 2014/0161646 A1 | 6/2014 | Taillardat | |

FOREIGN PATENT DOCUMENTS

| | | |
|---|---|---|
| JP | 2006-87186 A | 3/2006 |
| JP | 2006-180650 A | 7/2006 |
| JP | 2006-296168 A | 10/2006 |
| JP | 2008-178180 A | 7/2008 |
| JP | 2008-295155 A | 12/2008 |

OTHER PUBLICATIONS

International Search Report of PCT/JP2015/055436, dated May 19, 2015. [PCT/ISA/210].

* cited by examiner

FIG. 4   FIG. 4A (a)

| No | PHASE OF OPEN PHASE | | OPEN-PHASE DE-TECTION UNIT 13 | CURRENT DE-TECTION UNIT 12 | DETERMINATION |
|---|---|---|---|---|---|
| 1 | OPEN PHASE ON Y SIDE | T1 | ABNORMAL (H) | ABNORMAL (2f) | DETERMINE THERE IS OPEN PHASE IN Y CONNECTION |
| 2 | OPEN PHASE ON Y SIDE | R1 OR S1 | ABNORMAL (H) | ABNORMAL (2f) | DETERMINE THERE IS OPEN PHASE IN Y CONNECTION |
| 3 | OPEN PHASE ON DELTA SIDE | T2 | NORMAL (L) | ABNORMAL (2f) | DETERMINE THERE IS OPEN PHASE IN DELTA CONNECTION |
| 4 | OPEN PHASE ON DELTA SIDE | R2 OR S2 | NORMAL (L) | ABNORMAL (2f) | DETERMINE THERE IS OPEN PHASE IN DELTA CONNECTION |
| 5 | OPEN PHASE ON Y SIDE AND DELTA SIDE | T1 AND T2 | ABNORMAL (H) | ABNORMAL (2f) | DETERMINE THERE IS OPEN PHASE IN Y CONNECTION (BOTH IN PRACTICE) |
| 6 | OPEN PHASE ON Y SIDE AND DELTA SIDE | R1 AND R2 ARE OPEN PHASE, OR S1 AND S2 ARE OPEN PHASE | ABNORMAL (H) | ABNORMAL (2f) | DETERMINE THERE IS OPEN PHASE IN Y CONNECTION (BOTH IN PRACTICE) |
| 7 | NORMAL | NONE | NORMAL (L) | 12f | DETERMINE AS NORMAL |

FIG. 4B (b)

| No | PHASE OF OPEN PHASE | | OPEN-PHASE DE-TECTION UNIT 13 | CURRENT DE-TECTION UNIT 12 | DETERMINATION |
|---|---|---|---|---|---|
| 1 | OPEN PHASE ON Y SIDE | T1 | NORMAL (L) | ABNORMAL (2f) | DETERMINE THERE IS OPEN PHASE IN Y CONNECTION |
| 2 | OPEN PHASE ON Y SIDE | R1 OR S1 | NORMAL (L) | ABNORMAL (2f) | DETERMINE THERE IS OPEN PHASE IN Y CONNECTION |
| 3 | OPEN PHASE ON DELTA SIDE | T2 | ABNORMAL (H) | ABNORMAL (2f) | DETERMINE THERE IS OPEN PHASE IN DELTA CONNECTION |
| 4 | OPEN PHASE ON DELTA SIDE | R2 OR S2 | ABNORMAL (H) | ABNORMAL (2f) | DETERMINE THERE IS OPEN PHASE IN DELTA CONNECTION |
| 5 | OPEN PHASE ON Y SIDE AND DELTA SIDE | T1 AND T2 | ABNORMAL (H) | ABNORMAL (2f) | DETERMINE THERE IS OPEN PHASE IN Y CONNECTION (BOTH IN PRACTICE) |
| 6 | OPEN PHASE ON Y SIDE AND DELTA SIDE | R1 AND R2 ARE OPEN PHASE, OR S1 AND S2 ARE OPEN PHASE | ABNORMAL (H) | ABNORMAL (2f) | DETERMINE THERE IS OPEN PHASE IN Y CONNECTION (BOTH IN PRACTICE) |
| 7 | NORMAL | NONE | NORMAL (L) | 12f | DETERMINE AS NORMAL |

CONVERTER DEVICE

CROSS REFERENCE TO RELATED APPLICATIONS

This application is a National Stage of International Application No. PCT/JP2015/055436 filed Feb. 25, 2015, the contents of all of which are incorporated herein by reference in their entirety.

FIELD

The present invention relates to a converter device that converts an alternating-current voltage into a direct-current voltage.

BACKGROUND

There is a case where a converter device is constituted by a twelve-phase rectification transformer in order to suppress outflow of harmonics to an alternating-current system. There are a case where a twelve-phase rectification transformer is configured with its primary side being made as a Y connection and its secondary side being made as a Δ connection and a Y connection, and another case where a twelve-phase rectification transformer is configured with its primary side being made as a Δ connection and its secondary side being made as a Δ connection and a Y connection. In a twelve-phase rectification transformer, at the secondary side thereof, a three-phase alternating current with a phase difference of 30 degrees is generated and twelve-phase rectification is performed by subjecting the resultant to full-wave rectification (see Patent Literature 1).

CITATION LIST

Patent Literature

Patent Literature 1: Japanese Patent Application Laid-open No. 2008-295155

SUMMARY

Technical Problem

In Patent Literature 1, when open phase is caused, it is difficult to determine whether the open phase is caused on a Δ connection side or on a Y connection side.

The present invention has been achieved in view of the above circumstances, and an object of the present invention is to provide a converter device that, when open phase is caused, can output an indication as to whether the open phase is caused on a Δ connection side or on a Y connection side.

Solution to Problem

In order to solve the above-mentioned problem and achieve the object, the present invention provides a converter device comprising: a converter circuit unit that converts alternating-current voltages supplied from two systems, which are a Δ connection and a Y connection of a twelve-phase rectification transformer, into a direct-current voltage; a current detection unit that detects a current of a direct-current bus connected to the converter circuit unit; an open-phase detection unit that is connected to a side of the Δ connection or a side of the Y connection and detects whether there is open phase caused in the connection connected to the open-phase detection unit; and an output unit 15 that, when it is detected that there is open phase caused in the Δ connection or the Y connection based on a detection signal obtained by the detection of the open-phase detection unit and a current value of the direct-current bus detected by the current detection unit, outputs an indication that there is open phase caused in the Δ connection or the Y connection.

Advantageous Effects of Invention

When open phase is caused, the converter device according to the present invention can output an indication as to whether open phase is caused on a Δ connection side or on a Y connection side.

BRIEF DESCRIPTION OF DRAWINGS

FIGS. 4A and 4B are charts for explanation for operations of the determination unit according to the embodiment.

DESCRIPTION OF EMBODIMENTS

A converter device according to an embodiment of the present invention will be described below in detail with reference to the drawings. The present invention is not limited to the embodiments.

Embodiment

Figure 1:
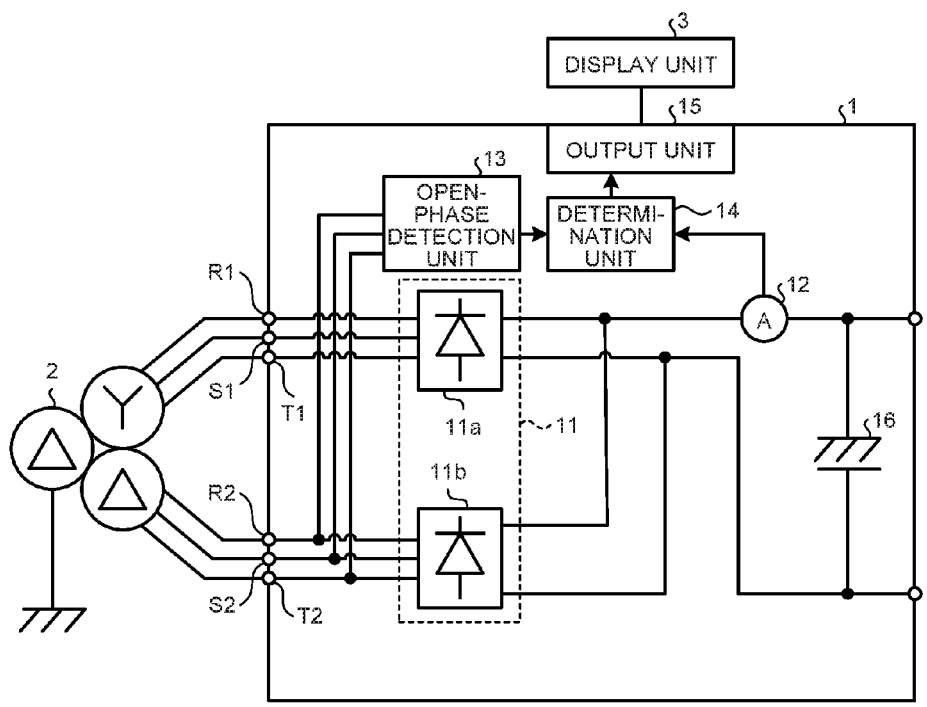
FIG. 1 is a configuration diagram of a converter device according to an embodiment.

FIG. 1 is a diagram illustrating a configuration of a converter device 1 according to an embodiment. The converter device 1 converts an alternating-current voltage supplied from a twelve-phase rectification transformer 2 into a direct-current voltage and outputs the direct-current voltage obtained therefrom. In the present embodiment, while a primary side of the twelve-phase rectification transformer 2 is configured by a Δ connection, the primary side may be configured by a Y connection.

The converter device 1 includes a converter circuit unit 11 that coverts an alternating-current voltage into a direct-current voltage, a current detection unit 12 that detects a current of a direct-current bus, an open-phase detection unit 13 that detects open phase, a determination unit 14 that determines whether there is open phase, an output unit 15 that outputs a determination result, and a smoothing capacitor 16 that smooths a voltage.

The converter circuit unit 11 converts an alternating-current voltage supplied from two systems, that are a Δ connection and a Y connection of the twelve-phase rectification transformer 2, into a direct-current voltage. The converter circuit unit 11 includes a Y-connection converter circuit unit 11a that is connected to a Y connection side and a Δ-connection converter circuit unit 11b that is connected to a Δ connection side.

The current detection unit 12 detects a current of a direct-current bus that is connected to the converter circuit unit 11.

The open-phase detection unit 13 is connected to the Δ connection side or the Y connection side and detects whether open phase is caused in the connection connected to the detection unit 13. In the present embodiment, the open-phase detection unit 13 is described as being configured to be connected to the Δ connection side, but the open-phase detection unit 13 may be configured to be connected to the Y connection side. A specific configuration of the open-phase detection unit 13 is described later.

The determination unit 14 determines that open phase is caused in the Δ connection or the Y connection based on a detection signal obtained by the detection of the open-phase detection unit 13 and a current value of the direct-current bus detected by the current detection unit 12. Further, the determination unit 14 also determines that open phase is not caused in the Δ connection and the Y connection based on the detection signal obtained by the detection of the open-phase detection unit 13 and a current value of the direct-current bus detected by the current detection unit 12.

Specifically, when a period of the current value of the direct-current bus detected by the current detection unit 12 is not twelvefold a power-supply frequency f, that is, when the period is double a power-supply period, the determination unit 14 determines that open phase is caused in the Δ connection or the Y connection based on the detection signal obtained by the detection of the open-phase detection unit 13. When no open phase is caused in the Δ connection and the Y connection, the period of the current value of the direct-current bus detected by the current detection unit 12 becomes twelvefold the power-supply frequency f.

When it is detected that open phase is caused in the Δ connection or the Y connection based on the detection signal obtained by the detection of the open-phase detection unit 13 and the current value of the direct-current bus detected by the current detection unit 12, the output unit 15 outputs an indication that there is open phase in the Δ connection or the Y connection. Further, when it is determined that open phase is not caused in the Δ connection and the Y connection by the determination unit 14, the output unit 15 outputs an indication that there is no open phase in the Δ connection and the Y connection. Specifically, the output unit 15 outputs an indication that there is open phase in the Δ connection or the Y connection, or an indication that there is not open phase in the Δ connection and the Y connection based on a determination result of the determination unit 14. A display unit 3 displays, based on the output from the output unit 15, a status of occurrence of the open phase in the Δ connection or the Y connection, or a status of non-occurrence of the open phase in the Δ connection and the Y connection.

The smoothing capacitor 16 smooths a direct-current voltage by eliminating ripple components of a direct-current voltage obtained by the conversion of the converter circuit unit 11.

Figure 2:
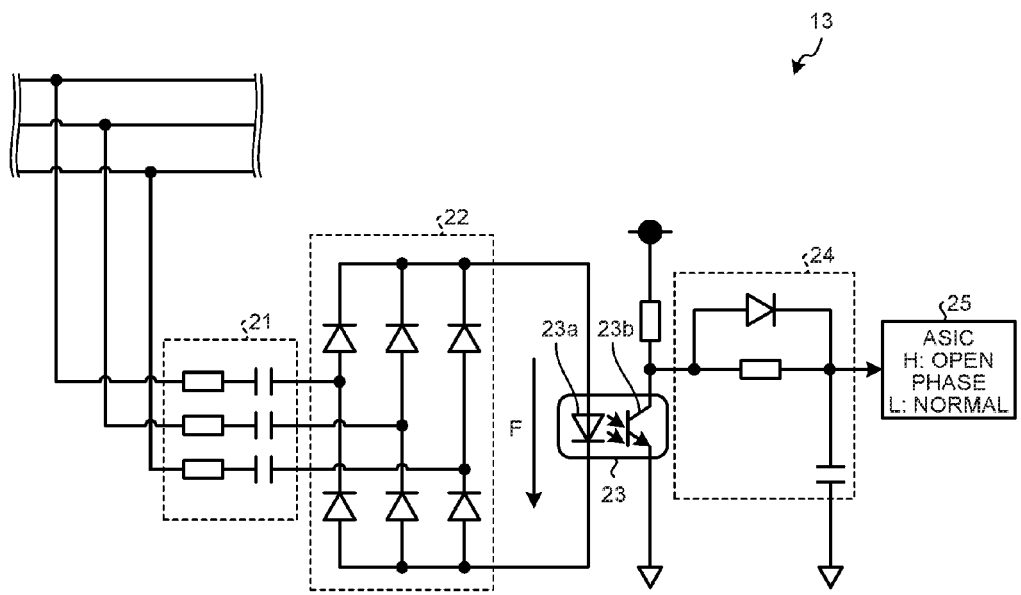
FIG. 2 is a configuration diagram of an open-phase detection unit according to the embodiment.

A specific configuration of the open-phase detection unit 13 is described here. As illustrated in FIG. 2, the open-phase detection unit 13 includes a voltage step-down unit 21 that steps down an alternating-current voltage, a rectification unit 22 that rectifies the stepped-down alternating-current voltage, a photocoupler 23 that performs signal conversion, a filter unit 24 that performs filtering, and an open-phase detection unit 25 that detects whether or not open phase is being caused.

The step-down unit 21 is connected to an R-phase, an S-phase and a T-phase of the Δ connection, and steps down alternating-current voltages outputted from the respective phases.

The rectification unit 22 is constituted by a diode bridge and performs full-wave rectification on an output voltage of the step-down unit 21.

The photocoupler 23 includes a light-emitting diode 23a that emits light and a phototransistor 23b that receives light. The light-emitting diode 23a emits light based on an output voltage of the rectification unit 22. The phototransistor 23b receives light outputted from the light-emitting diode 23a and converts the received light into an electric signal.

The filter unit 24 outputs a signal based on an operation of the photocoupler 23. When the open-phase detection unit 25 detects a status of occurrence of the open phase in any of the R-phase, the S-phase and the T-phase of the Δ connection based on the signal inputted from the filter unit 24, the open-phase detection unit 25 outputs an H signal indicating abnormality to the determination unit 14. When the open-phase detection unit 25 detects non-occurrence of the open phase on the Δ connection side based on the signal inputted from the filter unit 24, the open-phase detection unit 25 outputs an L signal indicating normality to the determination unit 14. The determination unit 14 determines whether the open phase is caused in the Δ connection based on the signal inputted from the open-phase detection unit 25.

Figure 3:
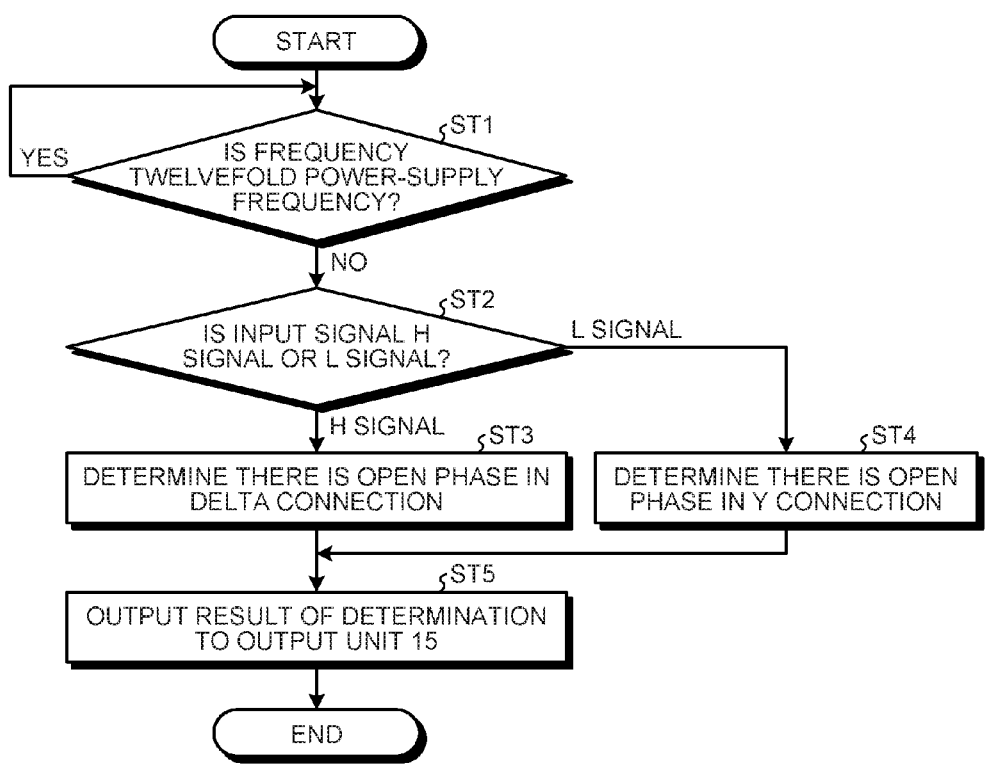
FIG. 3 is a flowchart for explaining a specific process performed by a determination unit according to the embodiment.

A specific process performed by the determination unit 14 is described here with reference to a flowchart illustrated in FIG. 3.

At Step ST1, the determination unit 14 determines whether the period of a current value of the direct-current bus detected by the current detection unit 12 is twelvefold the power-supply frequency f. When it is twelvefold the power-supply frequency f (YES), this process is repeated, and when it is not twelvefold the power-supply frequency f (NO), the process proceeds to Step ST2.

At Step ST2, the determination unit 14 determines whether a signal inputted from the open-phase detection unit 13 is an H signal or an L signal. When it is determined that the signal is an H signal, the process proceeds to Step ST3, and when it is determined that the signal is an L signal, the process proceeds to Step ST4.

At Step ST3, the determination unit 14 determines that the open phase is caused in the Δ connection.

At Step ST4, the determination unit 14 determines that no open phase is caused in the Δ connection but open phase is caused in the Y connection.

At Step ST5, the determination unit 14 outputs a result of the determination in the process of Step ST3 or the process of Step ST4 to the output unit 15.

Next, operations of the determination unit 14 are described. FIG. 4A illustrates all patterns of results of determinations made by the determination unit 14 in the case where the open-phase detection unit 13 is connected to the Y connection side. FIG. 4B illustrates all patterns of results of determinations made by the determination unit 14 in the case where the open-phase detection unit 13 is connected to the Δ connection side. "ABNORMAL (H)" in the column of the open-phase detection unit 13 in (FIG. 4A and FIG. 4B means that open phase is caused in the connection connected to the detection unit 13, and the H signal indicating abnormality is outputted from the open-phase detection unit 13. "NORMAL (L)" in the column of the open-phase detection unit 13 in FIG. 4A and FIG. 4B means that open phase is not caused in the connection connected to the detection unit 13, and the L signal indicating normality is outputted from the open-phase detection unit 13.

"ABNORMAL (2f)" in the section of the current detection unit 12 in FIG. 4A and FIG. 4B means that a period of the current value of the direct-current bus detected by the current detection unit 12 is double the power-supply frequency f. "12f" in the section of the current detection unit 12 in FIG. 4A and FIG. 4B means that a period of the current value of the direct-current bus detected by the current detection unit 12 is twelvefold the power-supply frequency f.

No. 1 in FIG. 4A represents a case where a T1 phase on the Y connection side is open phase. In the case of No. 1, the open-phase detection unit 13 outputs the H signal indicating abnormality. A period of the current value of the direct-current bus detected by the current detection unit 12 is double the power-supply frequency f. Therefore, the determination unit 14 determines that there is open phase in the Y connection.

No. 2 in FIG. 4A represents a case where an R1 phase or an S1 phase on the Y connection side is open phase. In the case of No. 2, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Y connection.

No. 3 in FIG. 4A represents a case where a T2 phase on the Δ connection side is open phase. In the case of No. 3, the open-phase detection unit 13 outputs the L signal indicating normality. A period of the current value of the direct-current bus detected by the current detection unit 12 becomes double the power-supply frequency f. Therefore, the determination unit 14 determines that there is open phase in the Δ connection.

No. 4 in FIG. 4A represents a case where an R2 phase or an S2 phase on the Δ connection side is open phase. In the case of No. 4, the open-phase detection unit 13 outputs the L signal indicating normality. A period of the current value of the direct-current bus detected by the current detection unit 12 becomes double the power-supply frequency f. Therefore, the determination unit 14 determines that there is open phase in the Δ connection.

No. 5 in FIG. 4A represents a case where the T1 phase on the Y connection side and the T2 phase on the Δ connection side are open phase. In the case of No. 5, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Y connection. In the case of No. 5, because there is open phase also in the Δ connection, when a determination process is performed again after restoring the open phase in the Y connection to a normal state, the state of No. 5 becomes identical to that of No. 3, and the determination unit 14 determines that there is open phase in the Δ connection.

No. 6 in FIG. 4A represents a case where the R1 phase on the Y connection side and the R2 phase on the Δ connection side are open phase, or the S1 phase on the Y connection side and the S2 phase on the Δ connection side are open phase. In the case of No. 6, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Y connection. In the case of No. 6, because there is open phase also in the Δ connection, when a determination process is performed again after restoring the open phase in the Y connection to a normal state, the state of No. 6 becomes identical to that of No. 4, and the determination unit 14 determines that there is open phase in the Δ connection.

No. 7 in FIG. 4A represents a case of normality, where there is no open phase in the Y connection and the Δ connection. In the case of No. 7, the open-phase detection unit 13 outputs the L signal indicating normality. A period of the current value of the direct-current bus detected by the current detection unit 12 becomes twelvefold the power-supply frequency f. Therefore, the determination unit 14 determines that there is no open phase in the Y connection and the Δ connection and that it is a normal state.

No. 1 in FIG. 4B represents a case where the T1 phase on the Y connection side is open phase. In the case of No. 1, the open-phase detection unit 13 outputs the L signal indicating normality. A period of the current value of the direct-current bus detected by the current detection unit 12 becomes double the power-supply frequency f. Therefore, the determination unit 14 determines that there is open phase in the Y connection.

No. 2 in FIG. 4B represents a case where the R1 phase or the S1 phase on the Y connection side is open phase. In the case of No. 2, the open-phase detection unit 13 outputs the L signal indicating normality. A period of the current value of the direct-current bus detected by the current detection unit 12 becomes double the power-supply frequency f. Therefore, the determination unit 14 determines that there is open phase in the Y connection.

No. 3 in FIG. 4B represents a case where the T2 phase on the Δ connection side is open phase. In the case of No. 3, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Δ connection.

No. 4 in FIG. 4B represents a case where the R2 phase or the S2 phase on the Δ connection side is open phase. In the case of No. 4, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Δ connection.

No. 5 in FIG. 4B represents a case where the T1 phase on the Y connection side and the T2 phase on the Δ connection side are open phase. In the case of No. 5, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Δ connection. In the case of No. 5, because there is open phase also in the Y connection, when a determination process is performed again after restoring the open phase in the Δ connection to a normal state, the state of No. 5 becomes identical to that of No. 1, and the determination unit 14 determines that there is open phase in the Y connection.

No. 6 in FIG. 4B represents a case where the R1 phase on the Y connection side and the R2 phase on the Δ connection side are open phase, or a case where the S1 phase on the Y connection side and the S2 phase on the Δ connection side are open phase. In the case of No. 6, the open-phase detection unit 13 outputs the H signal indicating abnormality. A period of the current value of the direct-current bus detected by the current detection unit 12 becomes double the power-supply frequency f. Therefore, the determination unit 14 determines that there is open phase in the Δ connection. In the case of No. 6, because there is open phase also in the Y connection, when a determination process is performed again after restoring the open phase in the Δ connection to a normal state, the state of No. 6 becomes identical to that of No. 2, and the determination unit 14 determines that there is open phase in the Y connection.

No. 7 in FIG. 4B represents a case of normality, where there is no open phase in the Y connection and the Δ connection. In the case of No. 7, the open-phase detection unit 13 outputs the L signal indicating normality. A period of the current value of the direct-current bus detected by the current detection unit 12 becomes twelvefold the power-supply frequency f. Therefore, the determination unit 14 determines that there is no open phase in the Y connection and the Δ connection and that it is a normal state.

Figure 5:
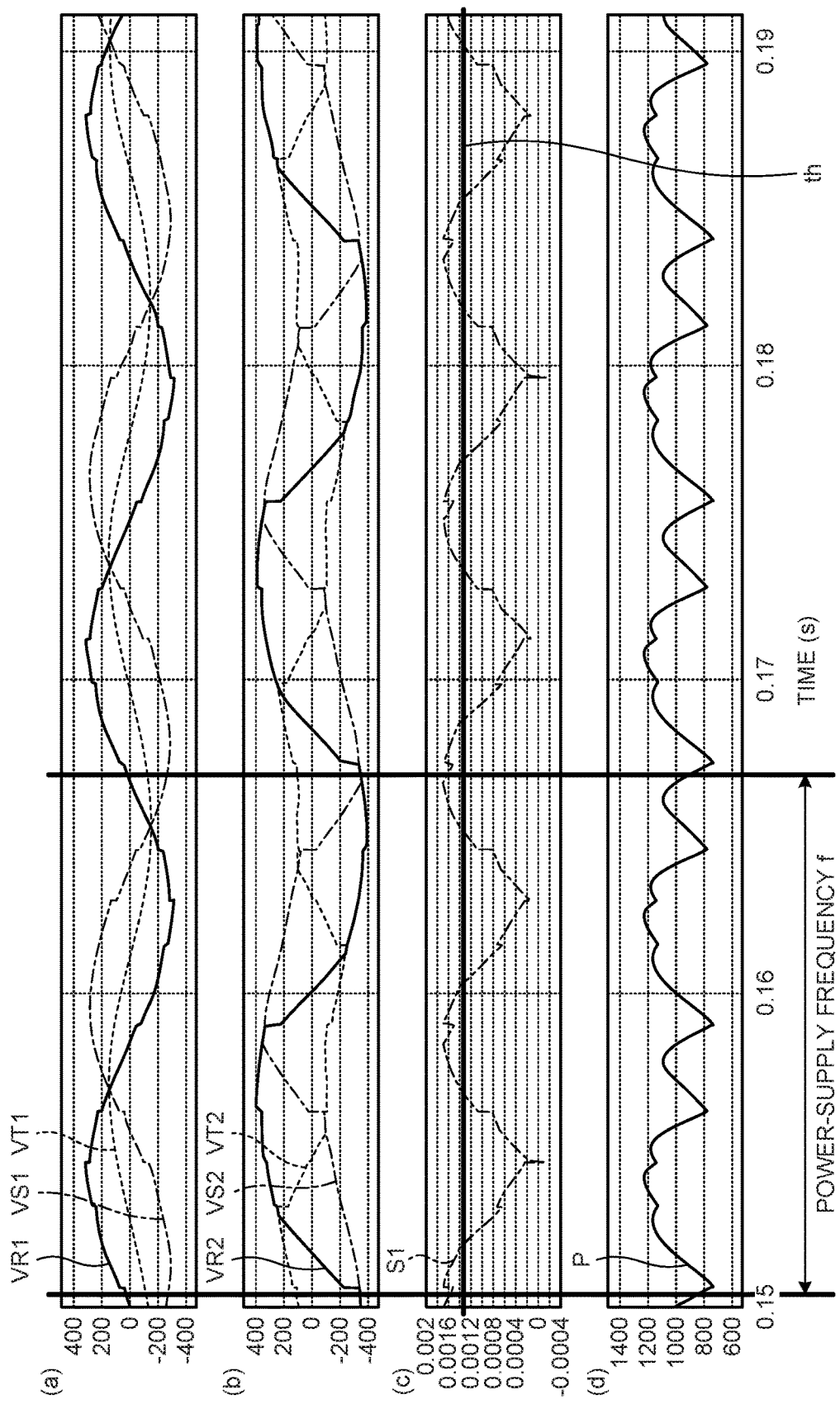
FIGS. 5A, 5B, 5C and 5D are charts illustrating signal waveforms in a case where the open-phase detection unit according to the embodiment is connected to a Y connection side and there is open phase on the Y connection side.

Operations of the determination unit 14 in a situation of No. 1 in FIG. 4A described above are explained here. FIGS. 5A, 5B, 5C and 5D illustrates signal waveforms in a case where the open-phase detection unit 13 is connected to the Y connection side and the T1 phase on the Y connection side is open phase. FIG. 5A illustrates voltage waveforms on the Y connection side. VR1 in FIG. 5A represents a voltage waveform of the R1 phase on the Y connection side, VS1 in FIG. 5A represents a voltage waveform of the S1 phase on the Y connection side, and VT1 in FIG. 5A represents a voltage waveform of the T1 phase on the Y connection side. FIG. 5B illustrates voltage waveforms on the Δ connection side. VR2 in FIG. 5B represents a voltage waveform of the R2 phase on the A connection side, VS2 in FIG. 5B represents a voltage waveform of the S2 phase on the Δ connection side, and VT2 in FIG. 5B represents a voltage waveform of the T2 phase on the Δ connection side.

As illustrated in FIG. 5C, because a detection signal S1 having been inputted from the open-phase detection unit 13 exceeds a threshold th, the determination unit 14 determines that open phase is caused in the Y connection based on the detection signal S1. Further, as illustrated in FIG. 5D, because a period P of a current value of the direct-current bus detected by the current detection unit 12 is double the power-supply frequency f, the determination unit 14 determines that there is abnormality. Therefore, the determination unit 14 determines that there is open phase in the Y connection.

Figure 6:
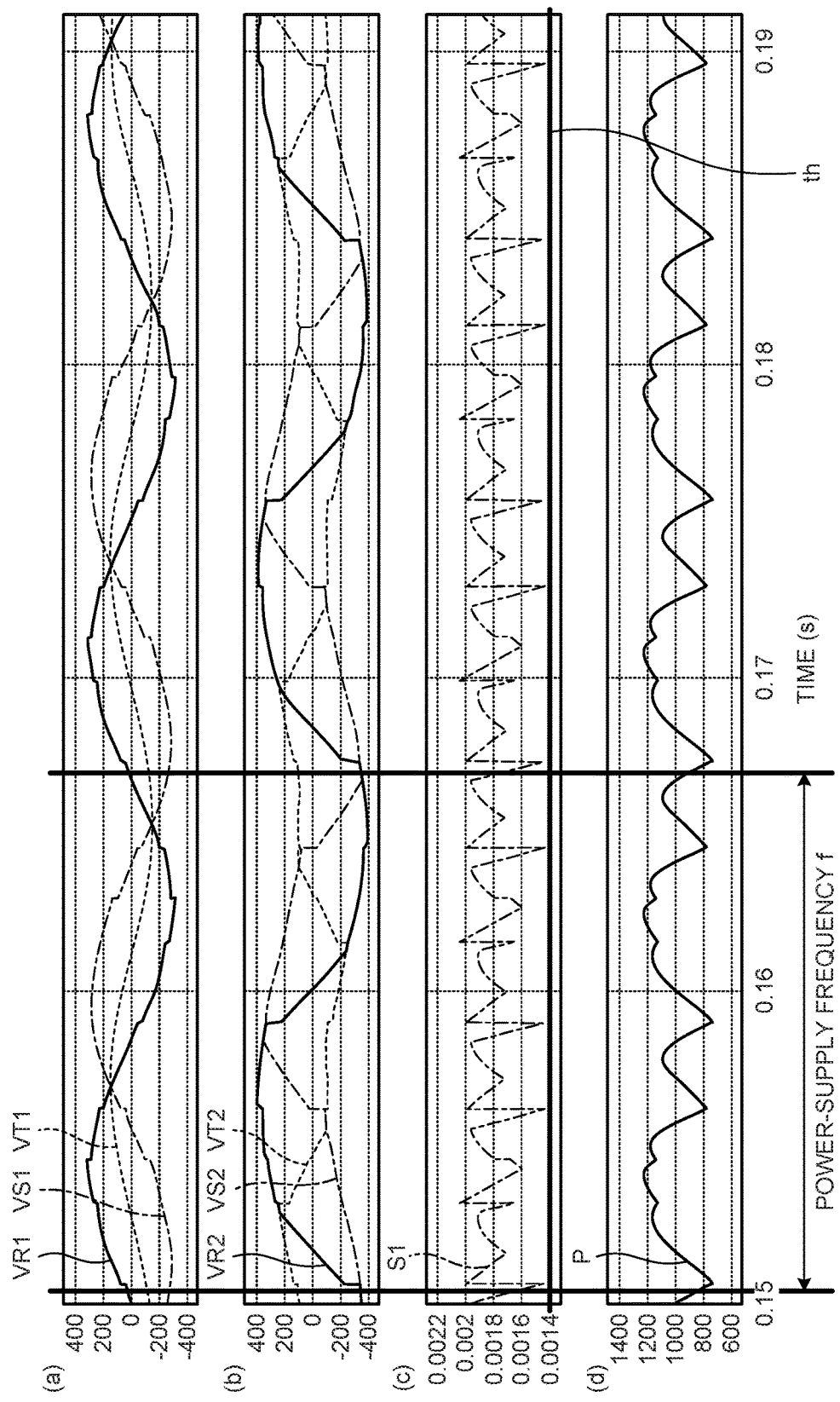
FIGS. 6A, 6B, 6C and 6D are charts illustrating signal waveforms in a case where the open-phase detection unit according to the embodiment is connected to a Δ connection side and there is open phase on the Y connection side.

Next, operations of the determination unit 14 in a situation of No. 1 in FIG. 4B described above are explained. FIGS. 6A, 6B, 6C and 6D illustrates signal waveforms in a case where the open-phase detection unit 13 is connected to the Δ connection side and the T1 phase on the Y connection side is open phase. FIG. 6A illustrates voltage waveforms on the Y connection side. VR1 in FIG. 6A represents a voltage waveform of the R1 phase on the Y connection side, VS1 in FIG. 6A represents a voltage waveform of the S1 phase on the Y connection side, and VT1 in FIG. 6A represents a voltage waveform of the T1 phase on the Y connection side. FIG. 6B illustrates voltage waveforms on the Δ connection side. VR2 in FIG. 6B represents a voltage waveform of the R2 phase on the A connection side, VS2 in FIG. 6B represents a voltage waveform of the S2 phase on the Δ connection side, and VT2 in FIG. 6B represents a voltage waveform of the T2 phase on the Δ connection side.

As illustrated in FIG. 6C because the detection signal S1 having been inputted from the open-phase detection unit 13 does not cross the threshold th, the determination unit 14 determines that the Δ connection is normal based on the detection signal S1. Further, as illustrated in FIG. 6D, because a period P of the current value of the direct-current bus detected by the current detection unit 12 is double the power-supply frequency f, the determination unit 14 determines that there is abnormality. Therefore, the determination unit 14 determines that there is open phase in the Y connection.

Figure 7:
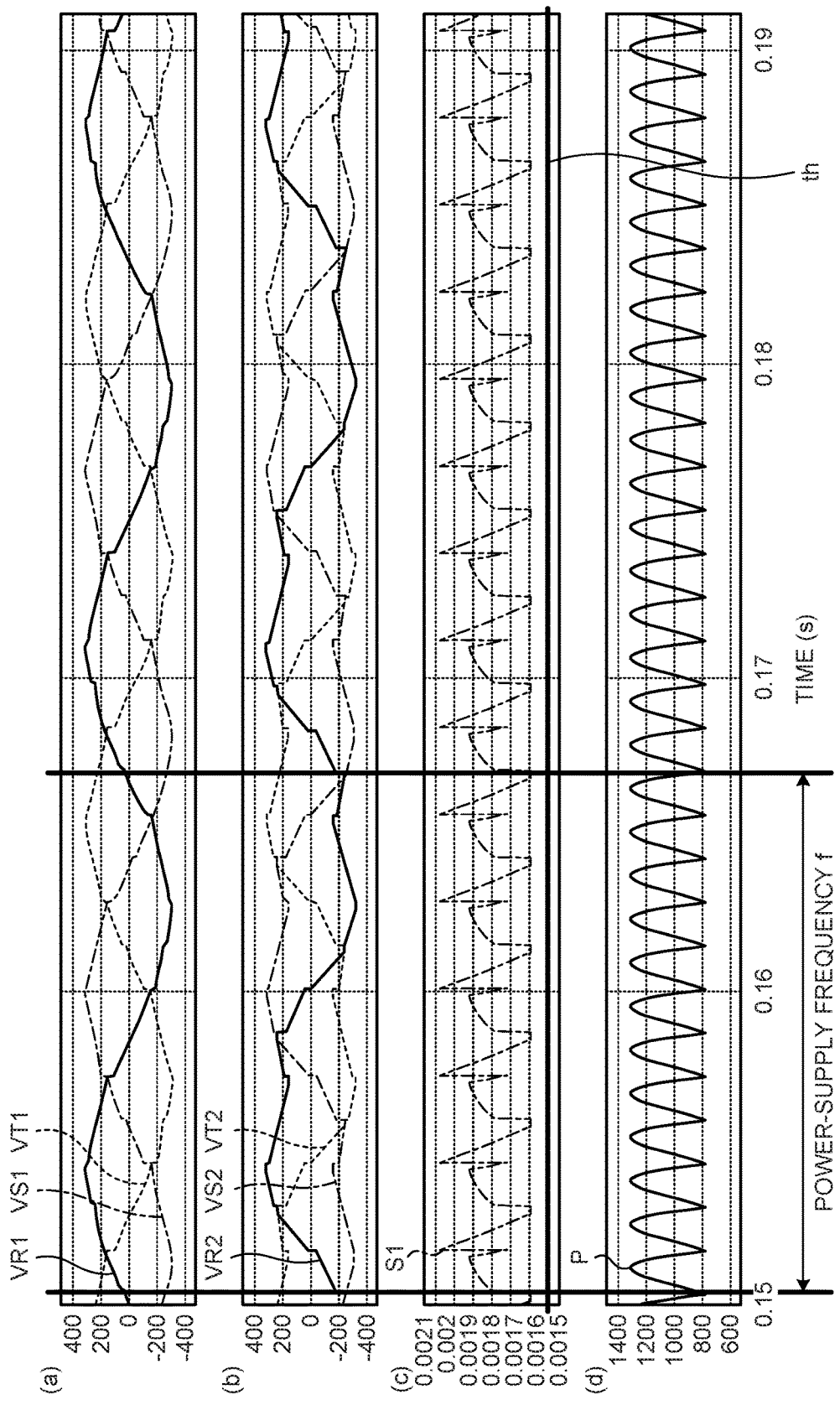
FIGS. 7A, 7B, 7C and 7D are charts illustrating signal waveforms in a case where the open-phase detection unit according to the embodiment is connected to the Δ connection side and there is no open phase in any of a Y connection and a Δ connection.

Next, operations of the determination unit 14 in a situation of No. 7 in FIG. 4A described above are explained. FIGS. 7A, 7B, 7C and 7D illustrates signal waveforms in a case where the open-phase detection unit 13 is connected to the Δ connection side and there is no open phase caused in the Y connection and the Δ connection. FIG. 7A illustrates voltage waveforms on the Y connection side. VR1 in FIG. 7A represents a voltage waveform of the R1 phase on the Y connection side, VS1 in FIG. 7A represents a voltage waveform of the S1 phase on the Y connection side, and VT1 in FIG. 7A represents a voltage waveform of the T1 phase on the Y connection side. FIG. 7B illustrates voltage waveforms on the Δ connection side. VR2 in FIG. 7B represents a voltage waveform of the R2 phase on the Δ connection side, VS2 in FIG. 7B represents a voltage waveform of the S2 phase on the Δ connection side, and VT2 in FIG. 7B represents a voltage waveform of the T2 phase on the Δ connection side.

As illustrated in FIG. 7C, because the detection signal S1 having been inputted from the open-phase detection unit 13 does not cross the threshold th, the determination unit 14 determines that the Δ connection is normal based on the detection signal S1. Further, as illustrated in FIG. 7D, because a period P of the current value of the direct-current bus detected by the current detection unit 12 is twelvefold the power-supply frequency f, the determination unit 14 determines that it is a normal state. Therefore, the determination unit 14 determines that there is no open phase caused in the Y connection and the Δ connection and that it is a normal state.

As described above, the converter device 1 includes the current detection unit 12 that detects a current of a direct-current bus that is connected to the converter circuit unit 11, the open-phase detection unit 13 that is connected to the Δ connection side or the Y connection side and detects whether there is open phase caused in the connection connected to the unit 13, and the output unit 15 that, when it is determined that there is open phase caused in the Δ connection or the Y connection or when it is determined that there is no open phase caused in the Δ connection and the Y connection based on a detection signal obtained by the detection of the open-phase detection unit 13 and a current value of the direct-current bus detected by the current detection unit 12, outputs the result of the determination. Therefore, when open phase is caused, it is possible to output from the output unit 15 an indication as to whether there is open phase caused on the Δ connection side or on the Y connection side.

The converter device 1 also includes the determination unit 14 that determines that there is open phase caused in the Δ connection or the Y connection or that there is no open phase caused in the Δ connection and the Y connection based on a detection signal obtained by the detection of the open-phase detection unit 13 and a current value of the direct-current bus detected by the current detection unit 12. Therefore, when open phase is caused, it is possible to determine whether there is the open phase caused on the Δ connection side or on the Y connection side.

Furthermore, when a period of the current value of the direct-current bus detected by the current detection unit 12 is not twelvefold the power-supply frequency f, that is, when it is double the power-supply period, the converter device 1 can determine that there is open phase caused in the Δ connection or the Y connection based on a detection signal obtained by the detection of the open-phase detection unit 13.

The configuration described in the above embodiment is only an example of the contents of the present invention, and the configuration can be combined with other publicly known techniques, while a part of the configuration can be omitted or modified without departing from the scope of the present invention.

REFERENCE SIGNS LIST

1 converter device, 2 twelve-phase rectification transformer, 3 display unit, 11 converter circuit unit, 12 current detection unit, 13 open-phase detection unit, 14 determination unit, 15 output unit, 16 smoothing capacitor, 21 voltage step-down unit, 22 rectification unit, 23 photocoupler, 23a light-emitting diode, 23b phototransistor, 24 filter unit, 25 open-phase detection unit.

The invention claimed is:

1. A converter device comprising:
 a converter circuit unit that converts alternating-current voltages supplied from two systems, which are a Δ connection and a Y connection of a twelve-phase rectification transformer, into a direct-current voltage;
 a current detection unit that detects a current of a direct-current bus connected to the converter circuit unit;
 an open-phase detection unit that is connected to a side of the Δ connection or a side of the Y connection and detects whether there is open phase caused in the connection connected to the open-phase detection unit;
 a determination unit that, when it is detected that there is open phase caused in the Δ connection or that there is open phase caused in the Y connection based on a detection signal obtained by the detection of the open-phase detection unit and a current value of the direct-current bus detected by the current detection unit, determines that there is open phase caused in the Δ connection or the Y connection; and
 an output unit that outputs an indication that there is open phase caused in the Δ connection or the Y connection based on a result of determination made by the determination unit.

2. The converter device according to claim 1, wherein
 based on the detection signal obtained by the detection of the open-phase detection unit and the current value of the direct-current bus detected by the current detection unit, the determination unit determines that there is no open phase caused in the Δ connection and the Y connection, and
 when the determination unit has determined that there is no open phase caused in the Δ connection and the Y connection, the output unit outputs an indication that there is no open phase caused in the Δ connection and the Y connection.

3. The converter device according to claim 1, wherein when a period of the current value of the direct-current bus detected by the current detection unit is not twelvefold a power-supply frequency, the determination unit determines that there is open phase caused in the Δ connection or the Y connection based on the detection signal obtained by the detection of the open-phase detection unit.

\* \* \* \* \*